United States Patent [19]

Hartgring et al.

[11] Patent Number: 4,709,255
[45] Date of Patent: Nov. 24, 1987

[54] SEMICONDUCTOR DEVICE COMPRISING A NON-VOLATILE STORAGE TRANSISTOR

[75] Inventors: Cornelius D. Hartgring; Johannes J. M. Joosten, both of Eindhoven, Netherlands

[73] Assignee: U.S. Philips Corporation, New York, N.Y.

[21] Appl. No.: 934,884

[22] Filed: Nov. 25, 1986

Related U.S. Application Data

[63] Continuation of Ser. No. 672,026, Nov. 16, 1984, abandoned.

[30] Foreign Application Priority Data

Jun. 27, 1984 [NL] Netherlands .................. 8402023

[51] Int. Cl.$^4$ ............... H01L 29/94; H01L 29/78; H01L 21/76
[52] U.S. Cl. ................... 357/23.5; 357/41; 357/49; 357/23.1; 365/185
[58] Field of Search ............ 357/23.5, 23.1, 41, 357/49; 365/185

[56] References Cited

U.S. PATENT DOCUMENTS 4,019,197 4/1977 Lohstroh et al. ................. 365/185
4,477,825 10/1984 Yaron et al. ..................... 357/55
4,517,732 5/1985 Oshikawa ....................... 357/23.5
4,532,535 7/1985 Gerber et al. .................. 357/23.5
4,590,504 5/1986 Guterman ...................... 357/23.11

FOREIGN PATENT DOCUMENTS

0086372 8/1983 European Pat. Off. ......... 357/23.5
58-114459 7/1983 Japan .......................... 357/23.5

Primary Examiner—Andrew J. James
Assistant Examiner—Jerome Jackson
Attorney, Agent, or Firm—Robert T. Mayer; Steven R. Biren

[57] ABSTRACT

A non-volatile storage cell has a floating conductive layer which is coupled to an injector region which is located in the semiconductor body and, viewed on the surface, is connected by a semiconductor zone entirely enclosed by a thick insulating layer to an electrode region of the storage transistor. The injector region is doped more weakly than the semiconductor zone and at least a part of the edge of the semiconductor zone follows in a self-registered manner an edge of the thick insulating layer. Furthermore, the floating conductive layer is located for at least half its size on the thick insulating layer.

12 Claims, 9 Drawing Figures

SEMICONDUCTOR DEVICE COMPRISING A NON-VOLATILE STORAGE TRANSISTOR

This is a continuation of application Ser. No. 672,026, filed Nov. 16, 1984, now abondoned

BACKGROUND OF THE INVENTION

The invention relates to a semiconductor device comprising a non-volatile storage transistor having a charge storage region which comprises an insulated conductive layer, and a control electrode coupled capacitively to the insulated conductive layer, while charge stored in the charge storage region represents information and the storage transistor for reading the information is included in a main current path of the storage cell, comprising a semiconductor body with a semiconductor surfeace at which are located a first and a second electrode region and a channel region of the storage transistor, which form part of the main current path, the semiconductor surface locally adjoining a first thick insulating layer which, viewed on the semiconductor surface, is bounded by a first edge, the first and the second electrode region each forming a rectifying junction with an adjoining common substrate region of a first conductivity type and the channel region being separated by a second thin insulating layer from a first part of the insulated conductive layer, wherein at the semiconductor surface there is disposed an injector region of a second conductivity type opposite to the first conductivity type which adjoins the common substrate region and which, viewed on the semiconductor surface, is entirely on losed by the first thick insulating layer and is separated by a third thin insulating layer from a second part of the insulated conductive layer, the first and the second part of the insulated conductive layer being interconnected by a third part separated by the first thick insulating layer from the semiconductor surface, while a semiconductor zone of the second conductivity type covered by the first thick insulating layer and forming an electrical connection for the injector region forms part of the second electrode region.

Such a semiconductor device is known from European Patent Application No. 86372 published on Aug. 24, 1983. This Patent Application discloses a non-volatile storage transistor having a floating gate, in which the injector region, viewed on the surface, is entirely enclosed by the first thick insulating layer obtained by local oxidation of the semiconductor body. On this enclosed injector region is disposed a thin tunnel oxide. By the use of local oxidation, in the case an enclosed tunnel region having a comparatively small surface area can be obtained by means of a photolithographically formed and oxidation-resistant mask still having comparatively large dimensions because after oxidation the non-oxidized part of the semiconductor surface is automatically smaller than the provided mask due to growth under this mask.

Generally, a comparatively high programming voltage is required for programming non-volatile storage transistors. This voltage is higher than the voltage s which are usual in conventional integrated circuits without non-volatile storage transistors. Frequently, non-volatile storages are therefore manufactured by means of a particular technology adapted to the high programming voltage. It is then of importance inter alia that the breakdown voltage of the pn junctions and the parasitic threshold voltage in that part of the semiconductor device which is covered by a comparatively thick field oxide are sufficiently high so that the programming voltage in the semiconductor device does not produce breakdown and does not lead to parasitic channel formation.

The choice of the value of the programming voltage depends upon the desired programming time and the desired hold time. The hold time is determined to a considerable extent by the thickness and the quality of the third thin insulating layer present on the injector region. The programming time is further dependent to a considerable extent upon the chosen third thin insulating layer and upon the value of the voltage difference which is available during programming between the injector region and the insulated conductive layer. This voltage difference is a part of the programming voltage practically determined by the ratio between the capacitance of the insulated conductive layer with respect to the control electrode and the overall capacitance of the insulated conductive layer. This overall capacitance comprises, besides the capacitance with respect to the control electrode, also the capacitance with respect to the control electrode zone and the injector region, the capacitance with respect to the substrate region and the capacitance with respect to the first electrode zone. The said capacitance ratio is designated as the coupling factor.

The known storage transistor described above has, as stated, the advantage that the tunnel region is comparatively small. However, a disadvantage is inter alia that in this storage transistor the second electrode zone has joined to it a comparatively large doped subzone which is situated under the first thick insulating layer. This additional subzone has to be comparatively large in order to ensure that the third thin insulating layer is continuously located above this subzone and moreover the tunnel region is continuously connected to the part of the second electrode zone not covered by the thick insulating layer, also if the masks used in the manufacture, which are important in this respect, are not ideally aligned.

SUMMARY OF THE INVENTION

The present invention has for its object to provide a comparatively small storage cell which can be programmed within a reasonable programming time with a comparatively low programming voltage. It is based inter alia on the recognition of the fact that the third insulating layer not only preferably has a small surface area, but that also a high quality of the third insulating layer is of major importance and that it is therefore favorable if the doping required for the injector region is provided during the manufacture only at a later stage in the semiconductor body. It is further also based on the recognition of the fact that the doping concentration and/or the doping quantity used in the injector region can be advantageously chosen to be independent or at least to a considerable extent independent of the doping concentration and/or the doping quantity in the part of the second electrode zone which forms an electrical connection for the injector region.

According to the invention, a semiconductor device of the kind described above is characterized in that the injector region is doped more weakly than the semiconductor zone and in that the semiconductor zone, viewed on the semiconductor surface, has a circumference of which at least a part follows in a self-registered manner the first edge of the first thick insultive layer has at least half the size of the insulated conductive layer.

In the semiconductor device according to the invention, the injector region can be doped substantially independently so that this doping can be chosen so as to correspond to the desired quality of the third thin insulating layer. Furthermore, the insulated conductive layer is located for a considerable part, i.e. for at least half of it, on the first thick insulating layer, as a result of which the desired strong capacitive coupling to the control electrode can be obtained in a simple manner so that the programming voltage may be comparatively low. When the space already occupied by the semiconductor zone located under the thick insulating layer at the semiconductor surface is also used to the greatest possible extent for this part located on the thick insulating layer, a comparatively compact structure is obtained.

A first important preferred embodiment of the semiconductor device according to the invention is characterized in that the semiconductor zone forms at least essentially part of the main current path of the storage cell.

When reading the storage cell, the reading current flowing through the main current path is a measure for the information content of the storage cell. In connection with the desired reading speed, it is of importance that the series resistance of the main current path is small. Besides, in connection with the space required for the storage cell at the semiconductor surface and the desired small capacitance of the main current path with respect to inter alia the common substrate region it is of importance that the dimensions of the main current paths are not larger than is necessary. The aforementioned first preferred embodiment has a main current path of comparatively small dimensions, which is located under the first thick insulating layer for a more or less large part of its length and for a more or less large part of its width. Due to the higher doping of the semiconductor zone, the series resistance can be kept sufficiently low. However, at the same time, a largest possible amount of space is available for the third part of the insulated conductive layer, as a result of which the storage cell is comparatively compact. As far as the third part of the insulated conductive layer is located above the semiconductor zone, due to the large thickness of the first insulating layer the contribution to the capacitance between the insulated conductive layer and the main current path will be sufficiently small to achieve that the relevant part of the third part of the insulated conductive layer can provide a reasonable contribution to the desired coupling factor.

The main current path of the storage preferably has, viewed on the semiconductor surface, at least locally a smallest width measured at right angles to the local current direction of the main current path which is at most substantially equal to the channel width of the storage transistor and the main current path is formed at least at the area of this smallest width at least over half the width by the semiconductor zone located under the first thick insulating layer.

In a further preferred embodiment of the semiconductor device according to the invention, the injector region is entirely enclosed, viewed on the semiconductor surface, by the semiconductor zone. Especially if the injector region is then arranged in fact within the main current path of the storage cell, very small storage cells can be obtained. With a view to a high packing density, the semiconductor zone moreover adjoins preferably the channel region of the storage transistor substantially over the whole width of this channel region.

In another important embodiment of the semiconductor device according to the invention, the second electrode region has a first surface portion, which is bounded by the first edge of the first thick insulating layer, is not covered by this insulating layer and adjoins the semiconductor zone and is preferably doped more highly than the semiconductor zone. In this manner, the storage transistor comprises three adjoining parts of the same conductivity type, which are, however, differently doped, i.e. the first surface portion of the second electrode region, the semiconductor zone and the injector region.

In a further preferred embodiment of the semiconductor device according to the invention, the second electrode region has a second surface portion, which is bounded by the first edge of the first thick insulating layer, is not covered by this insulating layer and adjoins the semiconductor zone and has substantially the same doping as the first surface portion, the first and the second surface portion being electrically interconnected at least in part by means of the semiconductor zone. As will be explained more fully hereinafter, it can be avoided by the use of a second electrode region having a first and a second surface portion that the channel length of the storage transistor also depends upon the alignment accuracy with which different masks are provided during the manufacture.

The storage cell preferably has an access transistor with a channel region, which is connected in series with the storage transistor, the second surface portion adjoining the channel region of the access transistor substantially over the whole width of this channel region. The access transistor can be used in a manner known per se for selection of the storage cell. Thus, this embodiment is particularly suitable for storages with a matrix of storage cells arranged in lines and columns.

The third part of the insulating conductive layer advantageously has a strip-shaped arm comprising the first part of the insulated conductive layer, Another preferred embodiment of the semiconductor device according to the invention is characterized in that the second electrode region has a projection formed by the semiconductor zone and composed of two parts, the injector region being located between these two parts. As will appear hereinafter, this embodiment can be manufactured with a comparatively high yield. The strip-shaped projection is made as narrow as possible and has a width measured at right angles to the longitudinal direction of the projection which is substantially equal to the width of the injector region measure substantially parallel thereto.

BRIEF DESCRIPTION OF THE DRAWING

The invention will now be described more fully with reference to several embodiments and the accompanying diagrammatic drawing, in which:

FIG. 6 is a part of a plan view of a second embodiment of the semiconductor device according to the invention; of which FIGS. 7 and 8 show diagrammatically and not to scale cross-sections taken on the line VII—VII and VIII—VIII respectively; of FIG. 6, while

DESCRIPTION OF THE PREFERRED EMBODIMENTS

Figure 1:
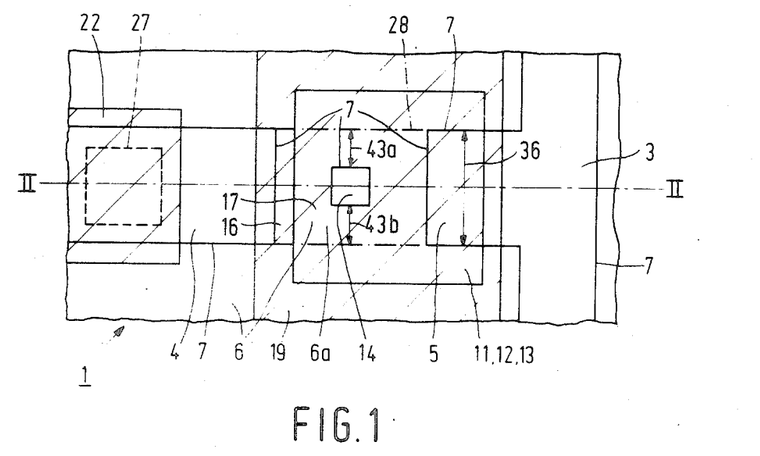
FIG. 1 shows a part of a plan view of a first embodiment of the semiconductor device according to the invention.
Figure 2:
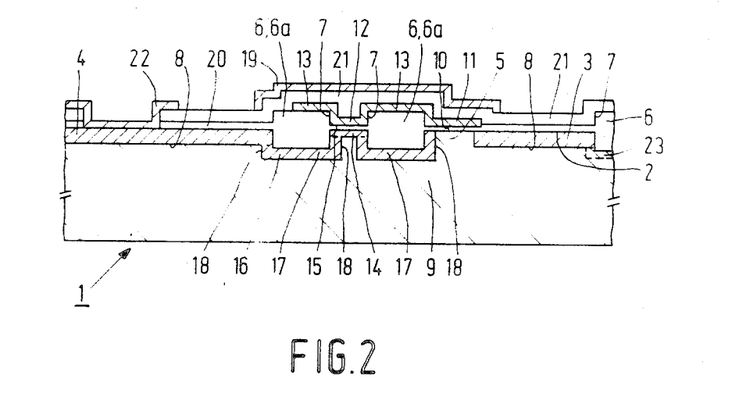
FIG. 2 shows diagrammatically and not to scale an associated cross-section taken on the line II—II of FIG. 1.

The first embodiment relates to a semiconductor device comprising at least one storage cell which comprises a non-volatile storage transistor and of which FIG. 1 and 2 show the part in which this non-volatile storage transistor is formed.

The storage transistor has a charge storage region which comprises an insulated conductive layer 11, 12, 13 and has a control electrode 19 which is coupled capacitively to the insulated conductive layer 11, 12, 13 while charge stored in the charge storage region represents information. For reading the information, the non-volatile storage transistor is included in a main current path 3, 5, 4, 22 of the storage cell.

The semiconductor device has a semiconductor body 1 with a semiconductor surface 2 at which are located a first and a second electrode region 3 and 4, respectively, and a channel region 5 of the storage transistor, which form part of the main current path 3, 5, 4, 22.

The semiconductor surface 2 locally adjoins a first thick insulating layer 6, which, viewed on the semiconductor surface 2, is bounded by a first edge 7. The first and the second electrode region 3 and 4, respectively, each form a rectifying junction 8 with an adjoining common substrate region 9 of a first conductivity type. The channel region 5 is separated by a second thin insulating layer 10 from a first part 11 of the insulated conductive layer 11, 12, 13. There is present at the semiconductor surface 2 an injector region 14 of a second conductivity type opposite to the first conductivity type, which adjoins the common substrate region 9 and which, viewed on the semiconductor surface 2, is enclosed entirely by the first thick insulating layer 6. This injector region 14 is separated by a third thin insulating layer 15 from a second part 12 of the insulated conductive layer 11, 12, 13. The first and second part 11 and 12, respectively, of the insulated conductive layer 11, 12, 13 are interconnected by a third part 13, which is separated by the first thick insulating layer 6 from the semiconductor surface 2. A semiconductor zone 16, 17 of the second conductivity type which is covered by the first thick insulating layer 6 and forms an electrical connection for the injector region 14 forms part of the second electrode region 4, 16, 17.

According to the invention, the injector region 14 is doped more weakly than the semiconductor zone 16, 17 and the semiconductor zone 16, 17 has, viewed on the semiconductor surface 2, a circumference 18, 28 of which at least a part 18 follows in a self-registered manner the first edge 7 of the first insulating layer 6. In the present example, as will be explained more fully, practically the whole circumference 18, 28 follows an edge of a part 6a of the thick insulating layer 6.

Furthermore, the third part 13 of the insulated conductive layer 11, 12, 13 at least has half the size of the whole insulated conductive layer 11, 12, 13. In the present example, the ratio of the size of the third part 13 to the overall size of the first and the second part 11 and 12, respectively, is about 18:7. The third part 13 covers a part 17 of the semiconductor zone 16, 17.

The first and second electrode regions 3 and 4, 16, 17 are covered at least in part by a usual insulating layer 20. Furthermore, an insulating layer 21 is provided, which separates inter alia the insulated conductive layer 11, 12, 13 from the control electrode 19. The second electrode zone 4, 16, 17 is provided with an electrical connection in the form of a conductive layer 22 which is connected via an opening 27 in the insulated layers 20 and 21 to the part 4 of the electrode zone 4, 16, 17. The first electrode region 3 may be provided with an electrical connection (not shown) in a similar manner and at a suitably chosen point. Where necessary, a channel stopper zone 23 of the same conductivity type as the common substrate region 9 may be provided in a usual manner under the thick insulating layer 6.

The storage transistor described has an insulated conductive layer 11, 12, 13 of a comparatively large extent and nevertheless occupies a comparatively small amount of space at the semiconductor surface due to its compact construction. The injector region 14 is, for example, about 2 $\mu$m $\times$ 2 $\mu$m. The channel length of the storage transistor may be about 3 $\mu$m, the channel width then being about 6 $\mu$m. The dimensions of the insulated conductive layer 11, 12, 13 are, for example, about 10 $\mu$m $\times$ 10 $\mu$m.

In the storage transistor of the first embodiment, a number of great advantages have been realized. Inter alia the injector region 14 is comparatively small and is, if required, adapted with respect to its doping so that the quality of the thin insulating layer 15 is not jeopardized. The dose used can be chosen comparatively independently of the other dopings and the doping can be moreover provided in the semiconductor body 1 at a latest possible stage of the manufacture and after the thick insulating layer 6 has already been obtained. In particular, the doping in the semiconductor zone 16, 17 can be chosen substantially independently of the doping in the injector region 14. As a result, the series resistance in the semiconductor zone 16, 17 can be so low that this zone 16, 17 can be included partly or entirely in the main current path of the storage cell and in this embodiment in the main current path of the storage transistor. The voltage loss obtained when reading the storage transistor is substantially not enlarged if in this manner a more or less large part of the electrode zone 4, 16, 17 is provided under the thick insulating layer 6. This fact can be advantageously utilized to obtain a compact structure, in which the insulated conductive layer 11, 12, 13 is provided for a comparatively large part on the thick insulating layer 6 and the electrode region 4, 16, 17 is located, where necessary, under this thick insulating layer 6 so that the structure occupies a smallest possible amount of space at the semiconductor surface and the capacitance between the insulated conductive layer 11, 12, 13 and the electrode region, 4, 16, 17 at the same time remains as small as possible. The last-mentioned small capacitance renders it possible to obtain a good coupling factor with a comparatively small insulated conductive layer 11, 12, 13, while a largest possible part of the programming voltage supplied between the control electrode 19 and the electrode region 4, 16, 17 is available across the thin insulating layer 15 between the insulated conductive layer 11, 12, 13 and the injector region 14. The charge transport takes place under the influence of this available voltage from and to the insulated conductive layer 11, 12, 13 as a result of which the information content of the storage transistor is changed.

For the sake of completeness, it should be noted that the described non-volatile storage transistor having a floating electrode 11, 12, 13 is of a frequently used type. The operation of this type of transistor will therefore not be described here further.

It should further be noted that U.S. Pat. No. 4,203,158 discloses a non-volatile storage transistor of this kind, in which the insulated conductive layer is also located for the major part on a thick insulating layer and in which the doping in the injector region can be chosen substantially independently of the other dopings and can be provided at a comparable late stage during the manufacture. In the known storage transistor, however, the injector region is not entirely enclosed by the thick insulating layer and moreover the insulated conductive layer is located entirely beside and not at all above the second electrode zone. As far as a self-registered transistion is obtained in this known transistor between the injector region and the second electrode zone, this self-registered transition is derived from the edges of the control electrode and of the insulated conductive layer. In a part of the semiconductor surface, in which first the doping required for the injector region is provided, the doping required for the electrode regions is also provided at a later instant. At the area of the transition between the second electrode zone and the injector region, the thin insulating layer 15 can thus be damaged. With the use of the present invention, on the contrary, the self-registered transition is derived not from an edge of the insulated conductive layer, but from another edge, i.e. from an edge of the thick insulating layer. Therefore, the insulated conductive layer can overlap the injector region to all sides. Also in comparison with this known storage transistor, the present invention consequently provides for a considerable gain in compactness of the transistor structure.

For the manufacture of the semiconductor device of the first embodiment, the starting material may be, for example, an n-type silicon body, in which one or more p-type surface regions are provided in a usual manner. One of these p-type surface regions can then constitute the common substrate region 9. However, the semiconductor device may also be manufactured starting from a p-type silicon body constituting the common substrate region 9. The resistivity of such a p-type silicon body is, for example, about 20 Ω.cm.

Figure 3:
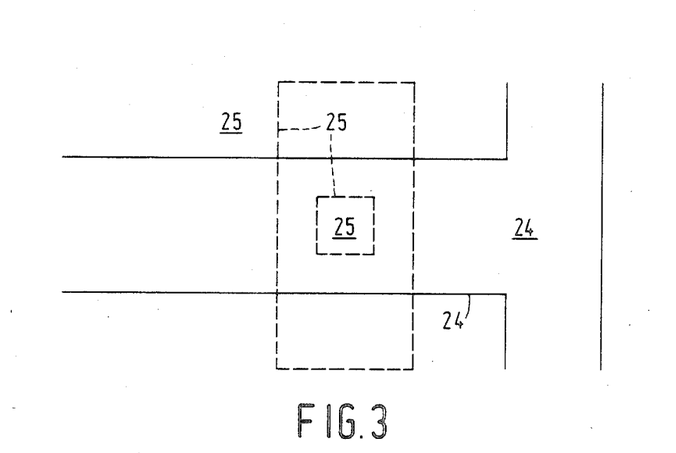
FIG. 3 is a plan view of a few masks used in the manufacture of this semiconductor device.

In a usual manner, a mask 24 masking against oxidation (FIG. 3) is provided on the surface of the p-type silicon body. The horizontally drawn strip has, for example, a width of about 7 μm and the vertically drawn strip has, for example, a width of about 5 μm. The mask 24 consists, for example, of a first layer of silicon oxide having a thickness of about 40 nm and a second laye of silicon nitride having a thickness of about 75 nm.

In a usual manner, a doping for the channel stopper zone 23 can be provided. For example, boron is implanted at a dose of about $3.10^{13}$ ions/cm$^2$. Subsequently, an oxidation treatment is carried out, in which an oxide layer having a thickness of, for example, about 0.3 μm is grown. A photolacquer mask 25 (FIG. 3) is then provided over the surface. This mask has an annular opening which encloses a centrally arranged square part of a mask, which has dimensions of, for example, about 3 μm × 3 μm. The part of the silicon nitride layer of the first mask 24 exposed within this opening is now selectively removed. Subsequently, an implantation treatment is carried out, in which the doping for the semiconductor zone 16, 17 is provided. This implantation treatment is masked by the mask 25 and by the parts of the silicon oxide layer already grown before and having a thickness of about 0.3 μm exposed within the opening in this mask 25. For example, arsenic may be implanted at a dose of about $1.10^{15}$ tons/cm$^2$. This implantation can be effected through the thin oxide layer of the mask 24. This thin oxide layer may also be removed beforehand within the opening in the mask 25 by means of an etching treatment of short duration. Depending upon the oxide layer that may still be present on the surface to be implanted and upon the desired doping concentration variation, the implantation energy can be chosen to lie between about 25 and about 100 keV.

After the photolacquer mask 25 has been removed, again an oxidation treatment is carried out, in which the thickness of the field oxide layer already present is enlarged to the thickness of, for example, 0.5 to 0.6 μm desired for the thick insulating layer 6. Simultaneously, oxide 6a grows also on the implanted surface, the rate of oxidation being comparatively high in this region due to the implantation treatment. Ultimately, the thick insulating layer 6, 6a preferably has the same thickness substantially throughout its area.

Figure 7:
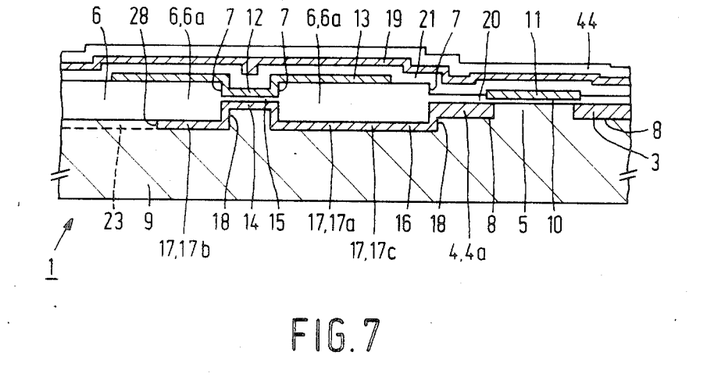
Figure 8:
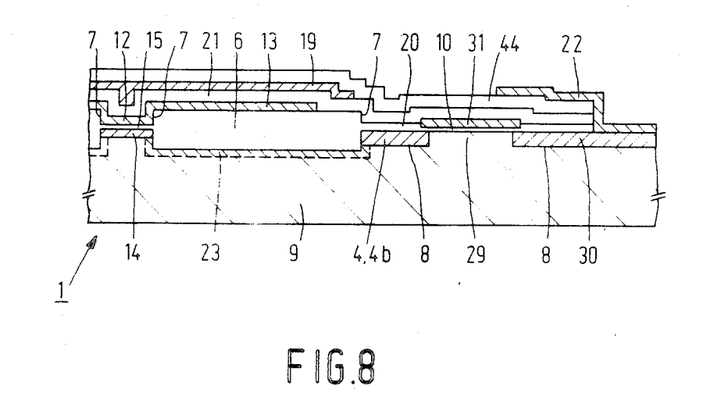

Inter alia due to the fact that in the practical embodiment the first edge 7 is rounded more strongly than is shown in FIGS. 2 and 7, the doping for the semiconductor zone 16, 17 penetrates only to a very small extent into the injector region 14. This correspondingly also applies to the doping for the channel stopper zone 23, which according to FIG. 8 seems to extend into the channel region 14. As far as in the practical embodiment the doping of the semiconductor zone 16, 17 and/or the channel stopper zone 23 extends into the injector region 14, small doping concentrations are concerned, as they occur in the tail of the doping profile of the relevant zone.

Subsequently, the remaining part of the mask 24 masking against oxidation is removed in a usual manner and a fresh thin oxide layer having a thickness of, for example, about 50 nm is grown on the parts of the surface not covered by the field oxide 6, 6a. This thin oxide layer serves to obtain the thin insulating layer 10. After this oxidation treatment, if desired, an implantation treatment with, for example, boron ions at a dose of about $4.10^{11}$ ions/cm$^2$ and an implantation energy of about 30 keV may be carried out. By this treatment, the desired threshold voltage is adjusted in a usual manner. If required, the part of the surface intended for the injector region 14 may be covered during this treatment by a photolacquer mask.

Figure 4:
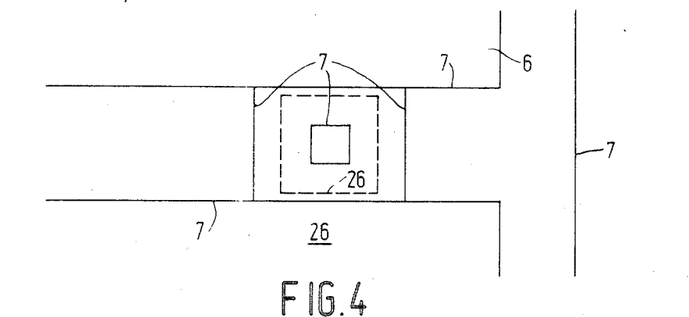
FIG. 4 is a plan view at a given stage of the manufacture of this semiconductor device.

Subsequently, there is provided on the surface, on which the edge 7 of the thick insulating layer 6, 6a is meanwhile visible, a photolacquer mask 26 (FIG. 4) having an opening which leaves free the region intended for the injector region 14 and its surroundings. The opening has, for example, dimensions of 5 μm × 5 μm. In the region intended for the injector region 14, which is bounded by the edge 7, the thin oxide layer having a thickness of about 50 nm is removed by means of an etching treatment of short duration and the doping for the injector region 14 is implanted. For example, arsenic ions are implanted at an implantation energy of about 25 keV. A suitable dose may be chosen, for example, between about $5.10^3$ and 1 to $2.10^{14}$ ions/cm².

After the photolacquer mask 26 has been removed, an oxidation treatment is carried out at about 950° C. in an oxygen-containing atmosphere, in which a thin oxide layer 15 having a thickness of, for example, about 10 nm is formed.

In a usual manner, a layer of polycrystalline or amorphous silicon having a thickness of about 0.5 μm can now be provided over the whole surface and this layer can be doped, for example, with phosphorus during the deposition or thereafter. This deposited silicon layer is patterned in order to obtain the conductive layer 11, 12, 13.

The doping for the electrode region 3 and the highly doped surface portion 4 of the electrode region 4, 16, 17 can be provided in a usual manner, for example by implantation of arsenic ions at a dose of about $5.10^{15}$ ions/cm² and an implantation energy of about 100 to 120 keV. Subsequently, a further oxidation treatment can be carried out for, for example, about 45 minutes at about 975° C. During this treatment, the provided dopings further diffuse into the semiconductor body 1. The oxide layer 20 on the electrode region 3 and on the surface portion 4 can now have a thickness of about 80 nm.

Thereafter, a layer of silicon oxide 21 having a thickness of, for example, about 0.5 μm can be deposited in a usual manner on the whole surface.

The manufacture of the semiconductor device can further be accomplished entirely in a usual manner. The control electrode 19 and the electrical connection 22 may be made, for example, of a suitable metal layer, such as an aluminum layer. Furthermore, a second polycrystalline or amorphous semiconductor layer may be used for the control electrode 19. After this second semiconductor layer has been patterned, it may be covered by means of thermal oxidation and/or deposition with an oxide layer (not shown). A metal layer may be deposited over this oxide layer and from this layer can be obtained inter alia the electrical connection 22 and a connection for the control electrode 19. The openings or windows 27 required for these connections in the relevant insulating layers, such as the layers 20 and 21, can be provided in a manner usual in the semiconductor art. If desired, before the metal layer is provided, an implantation with, for example, phosphorus ions may be carried out in the openings or windows for the connection of doped semiconductor regions.

A modification for providing the insulating layer 21 may consist in that first a thin oxide layer and a silicon nitride layer are deposited on the (first) semiconductor layer from which the insulated conductive layer 11, 12, 13 is obtained and in that then these layers are patterned together with the semiconductor layer. Before or after the implantation for the electrode region 3 and the surface portion 4, the edges of the insulated conductive layer 11, 12, 13 can then be oxidized. Subsequently, at least the last-mentioned silicon nitride layer is removed and the silicon oxide layer 21 is deposited. This modification inter alia has the advantage that the deposited oxide layer 21 can be chosen to be thinner because the edges of the insulated conductive layer 11, 12, 13 at which during operation comparatively high electrical fields can be readily obtained, are now additionally protected. The thinner oxide layer 21 results in a higher capacitance per unit surface area between the insulated conductive layer 11, 12, 13 and the control electrode 19, as a result of which the desired coupling factor can be realized with a smaller insulated conductive layer 11, 12, 13 and hence with a more compact structure. This thinner oxide layer 21 may also be formed entirely or in part by thermal generation.

The manufacturing method described can still be varied in many other ways. Within the scope of the present invention, it is especially of importance that an injector region 14 is obtained which is smaller than the mask pattern provided for this purpose photolithographically during the manufacture, while moreover the doping of the injector region both as to the dose and as to the concentration variation as well as the maximum doping concentration can be adapted to the fact that a thin insulating layer 15 of high quality is required on the injector region 14. In fact, during repeated programming, the desired charge transport takes place through this insulating layer 15, high electrical fields then being produced, while moreover it is of importance for the hold time of the stored information that in the absence of the programming voltage substantially no charge transport can take place through the insulating layer 15. The larger freedom of choice for the doping of the injector region 14 inter alia is connected with the fact that this doping, at least within the structure of the storage transistor, is provided solely within the injector region and not outside this region. Viewed on the surface, the circumference of the thin insulating layer 15 and the circumference of the surface portion in which the doping of the injector region is provided substantially coincide. The electrical connection of the injector region 14 is then realized with a more highly doped semiconductor zone 16, 17, which is provided in a self-registered manner with respect to the circumference or at least part of the circumference of the injector region 14 and with respect to the first edge 7 of the first insulating layer 6, 6a. It is substantially avoided that the surface portion in which the doping for the injector region is provided and the surface portion in which the doping for the more highly doped semiconductor zone 16, 17 is provided overlap each other.

Another important aspect is that the injector region 14, viewed on the surface, is entirely enclosed by the thick insulating layer 6, 6a and that both the more weakly doped injector region 14 and the more highly doped semiconductor zone 16, 17 extend under the insulated conductive layer 11, 12, 13. This, inter alia the storage transistor can be constructed so as to be comparatively small without it being necessary to correspondingly increase the programming voltage.

Figure 5:
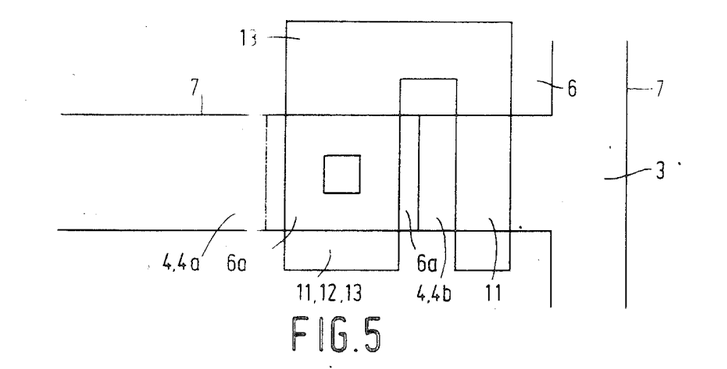
FIG. 5 is a simplified plan view of a modification of the first embodiment.

The storage transistor of the first embodiment has a particularly compact structure. Depending upon the envisaged application, however, it may inter alia be disadvantageous that the channel length of the storage transistor also depends upon the accuracy with which the mask for the insulated conductive layer 11, 12, 13 is aligned with respect to the part of the edge 7 of the thick insulating layer 6, 6a adjoining the channel region 5. This dependence may be avoided, for example, in that an adapted form is chosen for the insulated conductive layer 11, 12, 13. A possible form is indicated in FIG. 5, which otherwise for the sake of clarity is simplified with respect to FIG. 1 by the omission of parts of the storage transistor. With the use of the form shown in FIG. 5, the insulated conductive layer 11, 12, 13 has a strip-shaped arm which comprises the first part 11. The channel length of the storage transistor is determined by the width of the first part 11 and the second electrode region 4, 16, 17 has a second highly doped surface portion 4 which is provided simulaneously with the electrode region 3 and adjoins the channel region 5. The channel length now no longer depends upon the relative position of the edge 7 of the thick insulating layer with respect to the insulated conductive layer 11, 12, 13. The structure of the storage transistor as a whole is slightly enlarged, however, by the use of this measure.

Figure 6:
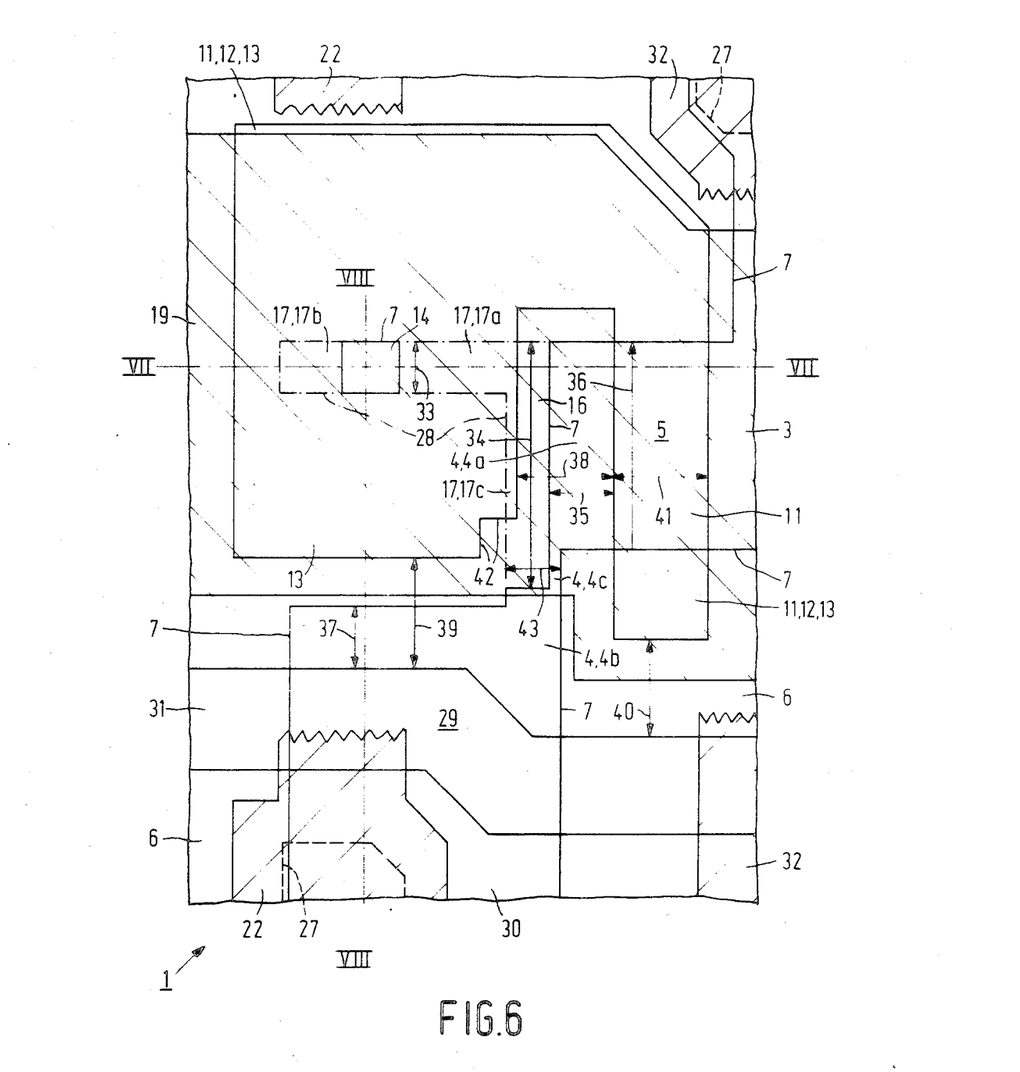

The second embodiment is a semiconductor device having a non-volatile storage which is composed of storage cells arranged in rows and columns, while the whole matrix of storage cells can be derived in a usual manner from the plan view of FIG. 6 by reflection with respect to the respective edges of this Figure.

In this second embodiment, the same reference numerals as in the first embodiment are used for corresponding parts. In each storage cell, a selection or access transistor is connected in series with the non-volatile storage transistor. The electrode region 4, 16, 17 is common to both transistors of the cell. The access transistor further has a channel region 29, an electrode region 30 and an insulated gate 31.

In this embodiment, the electrode region 30 of the access transistor but not the electrode region 4, 16, 17 is provided with the electrical connection 22. This connection 22 forms a bit line which is common to a column of storage cells and of which for the sake of clarity a part is shown only on the upper and on the lower side in FIG. 6. In a corresponding manner, in FIG. 6 a conductor track 32 common to two adjacent columns of storage cells is indicated, which is connected to electrode regions 3. Via these conductor tracks 32, the electrode regions 3 can be connected during operation to a point of reference potential, for example to ground. The conductor tracks 22 and 32 can be obtained during manufacture simultaneously and from the same conductive layer. The main current path of the storage cell is now situated between the connections 22 and 32 and comprises both the main current path 30, 29, 4 of the access transistor and the main current path 4, 5, 3 of the non-volatile storage transistor.

The gate electrode 31 of the access transistor is constituted by a conductor track 31 which is common to a row of storage cells and which may consist of semiconductor material and may be obtained during the manufacture simultaneously with the insulated conductive layer 11, 12, 13 of the storage transistor.

The control electrode 19 also extends in the row direction of the matrix of storage cells. In this embodiment, this control electrode 19 is obtained from a second layer of deposited semiconductor material, as described above. The conductors 19 and 31 extending in the row direction can cross in this manner the conductors 22 and 32 extending in the column direction because at the area of those crossings they are in fact separated from each other by an insulating layer 44 (FIG. 7, 8).

The insulated conductive layer 11, 12, 13 has a form which is comparable with the form shown in FIG. 5. A small injector region 14 of, for example, about 1.5 $\mu m \times 1.5$ $\mu m$ is present under this insulated conductive layer 11, 12, 13. The electrical connection for this injector region 14 is realized with the semiconductor zone 16, 17 of which the part of the circumference located under the first thick insulating layer 6 is designated by reference numeral 28. The semiconductor zone 16, 17 for this purpose is partly given the form of a strip-shaped overlapping zone as a strip-shaped projection of the second electrode region 4, 16, 17. The injector region 14 is situated between two mutually separated parts 17a and 17b, respectively, of the semiconductor zone 16, 17. Viewed on the surface, these parts 17a and 17b extend on two opposite sides of the injector region 14. The strip-shaped projection 17a, 17b has a width 33 measured at right angles to the longitudinal direction of the projection which is substantially equal to the width of the injector region 14 measured substantially parallel thereto. On the two remaining opposite sides of the injector region, the injector region 14 adjoins the common substrate region 9. In this manner, the part 17a, 17b of the semiconductor zone 16, 17 which serves as the electrical connection of the injector region 14 and is located under the third part 13 of the insulated conductive layer 11, 12, 13 is kept comparatively small. The contribution of this part 17a, 17b to the capacitance between the insulated conductive layer 11, 12, 13 and the second electrode region 4, 16, 17 remains limited inter alia for this reason.

The strip-shaped projection 17a, 17b of the semiconductor zone 16, 17 adjoins a highly doped first surface portion 4a of the electrode region 4, 16, 17 via a part 17c, 16 which has a very large width (width 34) as compared with this projection 17a, 17b. This large width of the part 17c, 16 is chosen in order to be able to arrange the insulated conductive layer 11, 12, 13 as far as possible on the first thick insulating layer 6 without the structure of the storage cell being enlarged.

The distance 38 between the edges substantially facing each other in parallel of the parts 11 and 13 of the insulated conductive layer 11, 12, 13 and the smallest distance 40 between the insulated conductive layer 11, 12, 13 and the gate electrode 31 are substantially equal to the width 41 of the strip-shaped first part 11 of the insulated conductive layer 11, 12, 13. These distances 38, 40 and 41 may be, for example, about 2.5 $\mu m$.

The smallest distance 37 between the gate electrode 31 and the part extending substantially parallel thereto of the edge 7 of the first thick insulating layer 6 is about 1.75 $\mu m$. At this point the distance 39 between the insulated conductive layer 11, 12, 13 and the gate electrode 31 is about 3 $\mu m$. In this manner, it is ensured on the one hand that also if the relevant masks are not ideally aligned, the electrode region 4, 16, 17 always has a highly doped second surface portion 4b which is bounded by the first edge 7 of the first thick insulating layer 6 and is not covered by this insulating layer 6, which surface portion 4b adjoins the channel region 29 of the access transistor substantially over the whole channel width of this transistor. On the other hand it is also ensured that the third part 13 of the insulated conductive layer 11, 12, 13 is always located on the first thick insulating layer 6 and does not extend to above the region intended for this highly doped surface portion 4b.

The smallest distance 35 between the first part 11 of the insulated conductive layer 11, 12, 13 and the part extending substantially parallel thereto of the edge 7 of the first thick insulating layer 6 is substantially equal to the corresponding distance 37, i.e. about 1.75 $\mu m$. The electrode region 4, 16, 17 will consequently also always have a highly doped first surface portion 4a, which adjoins the channel region 5 of the storage transistor substantially over the whole channel width 36 of this transistor, which channel region is bounded by the first edge 7 of the first thick insulating layer 6 and is not covered by the first insulating layer 6.

Due to the chosen dimensioning, in the ideal situation a particularly narrow highly doped surface portion 4c is present as connection between the first and the second surface portion 4a and 4b, respectively. When the relevant masks are not ideally aligned, this surface portion 4c may also be entirely absent, however. It is clear that the series resistance between the two highly doped surface portions 4a and 4b of the second electrode region 4, 16, 17 could be large in the absence of the semiconductor zone 16, 17. Like in the first embodiment, the semiconductor zone 16, 17 consequently essentially forms part of the main current path of the storage cell and of the second electrode region 4, 16, 17, i.e. in a manner such that without the presence of the semiconductor zone 16, 17 no reading current could flow through the storage cell or this reading current would flow through at least a comparatively high series resistance. In the absence of the semiconductor zone 16, 17, the information content of the storage transistor cannot be read or can be read only at a low reading speed.

The first and the second surface portion 4a and 4b, respectively; each adjoin the semiconductor zone 16, 17 and they are electrically interconnected at least in part through the semiconductor zone 16, 17.

The main current path 3, 5, 4, 29, 30, 22 of the storage cell has, viewed on the semiconductor surface 2, at least locally a smallest width 43 measured at right angles to the local current direction of the main current path, which is at most substantially equal to the channel width 36 of the storage transistor 3, 5, 4. Depending upon the topology chosen for the storage cell, the main current path is preferably locally narrowed. In the present second embodiment, a comparatively narrow connection as compared with the channel width of the two transistors is used between the surface portions 4a and 4b, as a result of which in this topology a largest possible amount of space is available for the third part 13 of the insulated conductive layer 11, 12, 13. A further gain in space is obtained here in that the main current path is constituted, at least at the area of this smallest width 43, over at least half this width 43 by the semiconductor zone 16, 17 located under the first thick insulating layer 6. The width 43 is preferably at least equal to the distance 35.

In the first embodiment, the main current path 3, 5, 4, 22 has its smallest width at the area of the injector region 14. The main current path is constituted here by two parts which are separated from each other by the injector region 14 and which have a width 43a and 43b, respectively. The smallest width of the main current path is here equal to the sum of the widths 43a and 43b. Throughout this smallest width the main current path is constituted by the part 17 of the semiconductor zone 16, 17 covered by the third part 13 of the insulated conductive layer 11, 12, 13.

The distance 38 between the first part 11 and the third part 13 of the insulated conductive layer 11, 12, 13 is about 2.5 μm. When the relevant masks are not ideally aligned, the part 13 can extent here beyond the edge 7 of the first thick insulating layer. As far as the third part 13 extends beyond this edge 17, during the doping treatment for the highly doped surface regions 4a, 4b and 4c of the electrode region 4, 16, 17, substantially no doping will be provided under this overlapping part because this overlapping part forms a masking for the doping during this treatment. In order to avoid the electrode region 4, 16, 17 consisting of two mutually separated parts 4 and 17, the part 17c, 16 is given a large width 34, the third part 13 of the insulated conductive layer 11, 12, 13 being locally recessed and being bounded by an edge 42 which lies at a sufficient distance from the edge 7 of the first thick insulating layer 6 so that it is ensured that the semiconductor zone 16, 17 always has a part 16 not covered by the insulated conductive layer 11, 12, 13. This part 16 connects the part 17 in fact covered by the insulated conductive layer 11, 12, 13 to the highly doped surface portion 4 of the electrode region 4, 16, 17 not covered by the first thick insulating layer 6. The area at which the insulated conductive layer 11, 12, 13 is recessed is chosen so that a good transition between the highly doped surface portions 4 and the semiconductor zone 16, 17 is obtained just at the area at which the semiconductor zone 16, 17 is located in the main current path of the storage cell. Both due to this transition and due to the higher doping of the semiconductor zone 16, 17 with respect to the injector region 14, the series resistance in the main current path of the storage cell is kept as low as possible so that the desired high reading speed is not jeopardized.

However, due to the chosen point of the connection between the highly doped surface portions 4 and the semiconductor zone 16, 17, an additional series resistance can be obtained in the electrical connection of the injector region 14 when the relevant masks are not ideally aligned. This series resistance is practically of minor or no importance, however, because the currents required for programming the storage transistors are very small. The voltage loss caused by the series resistance with these very small currents, is practically negligible.

In connection with the self-registered manner of providing the semiconductor zone 16, 17 it may be of importance to adapt the dopings, the implantation depths and the subsequent heat treatments, in which diffusion of the provided dopings occurs, to each other in a manner such that a continious uninterrupted electrode region 4, 16, 17 is obtained.

At the transition from the semiconductor zone 16, 17 to the injector region 14, a low-ohmic connection between these two differently doped regions of the same conductivity type is much less important. As far as a given series resistance is obtained at this transistion, it substantially does not unfavorably influence the operation of the storage cell. Even if the injector region 14 and the semiconductor zone 16, 17 do not really pass one into the other, but are separated by a very short distance, the operation of the storage cell is not jeopardized. If during programming a positive voltage is applied to the control electrode 19, this will result in a conducting channel being induced between the injector region 14 and the semiconductor zone 16, 17 separated therefrom. On the other hand, if during programming the positive voltage is supplied to the electrode region 4, 16, 17, the injector region 14 can also follow this voltage because the semiconductor zone 16, 17 and the injector region are located at any rate at such a short distance from each other that the punch-through voltage between them is very low.

For the sake of completeness it should be noted that, although during the manufacture an implantation treatment is preferably carried out for the injector region 14, this implantation treatment is not always necessary. If the third insulating layer 15 is sufficiently thin, the doping provided in the insulated conductive layer 11, 12, 13 can reach the semiconductor body through the third insulating layer 15 during the various heat treatments and can form there the injector region 14.

Figure 9:
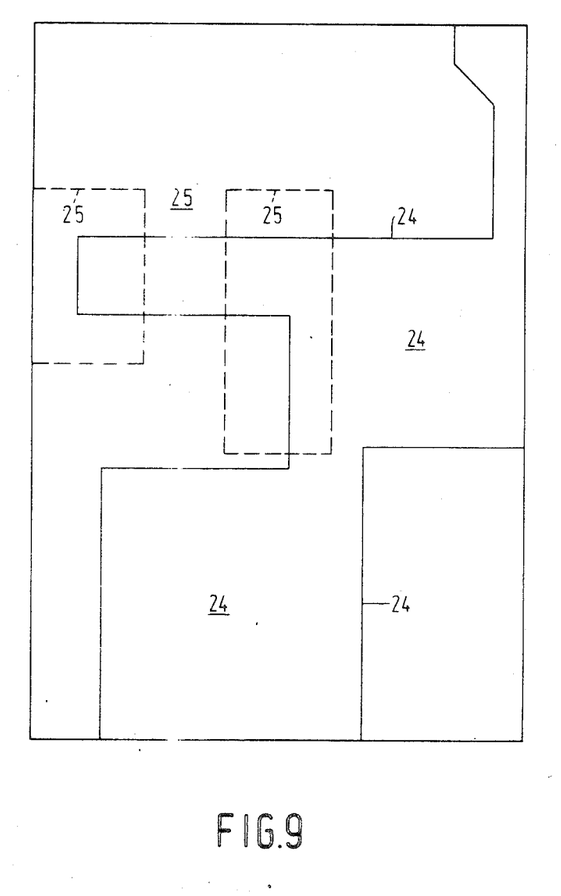
FIG. 9 is a plan view of masks which can be used in the manufacture of the semiconductor device of the second embodiment.

The semiconductor device of the second embodiment can be manufactured in the same manner as described above for the first embodiment. FIG. 9 shows the mask 24 and 25 to be used in the second embodiment. As compared with FIG. 3, which shows the corresponding masks 24 and 25 of the first embodiment, the mask 25 of FIG. 3 proves to have a small square region located above the area of the injector region 14, while in the mask 25 of FIG. 9 a strip of the mask located between two separated openings covers the area of the injector region 14. In the mask 25 of FIG. 9, the part of the photolacquer mask located above the area of the injector region 14 forms a continuous integral unit with the remaining part of the masking layer. This continuous masking layer can be provided with a greater accuracy and with a higher yield than the corresponding masking layer of FIG. 3. Inter alia in this connection, the second electrode region 4, 16, 17 preferably has a strip-shaped projection 17a, 17b composed of two parts 17a and 17b, the injector region 14 being located between these parts.

The present invention is not limited to the described embodiments. Within the scope of the invention, many modifications are possible for those skilled in the art. With the use of an insulated conductive layer having a strip-shaped arm comprising the first part, as shown, for example, in FIG. 5, the strip-shaped arm may be connected at both ends with the third part 13 of the insulated conductive layer 11, 12, 13 instead of at one of its ends.

The semiconductor zone is preferably provided entirely in a self-registered manner with respect to an edge of the first thick insulating layer 6, as described above. The doping to be provided for this semiconductor zone 16, 17 is then limited in that the oxide layer already grown before the mask 25 is provided has to be able to mask this doping. If the thickness of this oxide layer is chosen to be smaller and/or the doping of the semiconductor zone 16, 17 is increased so that the grown oxide layer does not or at least not entirely mask the doping, the whole surface region exposed in the openings of the mask 25 will be doped. The self-registered transition to the injector region 14 and to the surface portion 4 of the second electrode region 4, 16, 17 is then maintained. Furthermore, the mask 25 and the doping for the semiconductor zone 16, 17 may be provided before oxidation takes place. The first thick insulating layer 6 is obtained entirely in this case by a single oxidation treatment. The semiconductor zone 16, 17 preferably has a sheet resistance between about 80 and about 125$\Omega$. The sheet resistance of the electrode regions 3 and 30 and of the surface portions 4 of the second electrode region 4, 16, 17 is usually about 40$\Omega$ or less. The sheet resistance of the injector region 14 preferably lies in the range of about 300$\Omega$ to 5 to 8 k $\Omega$.

Although the common substrate region 9 is preferably p-type and the transistor or transistors is or are preferably n-channel transistors, the conductivity types in the embodiments may also be interchanged.

Instead of the indicated oxide layers, the insulating layers used may often also be, for example, layers of aluminum oxide, of silicon nitride or of silicon oxynitride. The conductive layers 19, 31 and 11, 12, 13 may be manufactured from suitable silicide layers or from suitable metal layers, such as molybdenum layers, instead of from semiconductor material. The conductive layers 22 and 32 may be obtained from, for example, tungsten instead of from aluminum. Alternatively, a thin layer of, for example, TiW may be added under this conductive layer. In the openings 27, the contact between metal tracks and the semiconductor material may be improvide in that, for example, PtSi or PtNiSi is provided in a usual manner. Also semiconductor materials other than silicon, for example germanium or $A_{III}B_V$ compounds, may be used for the semiconductor body and/or the semiconductor layers. Furthermore, one or more further protective insulating layers not shown may be provided over the semiconductor device. The semiconductive devices described may further be finished in a usual manner by mounting them in a conventional envelope.

The present invention may also advantageously be used in semiconductor devices comprising one or more storage cells, in which information is written electrically by applying programming voltages, but in which written information is erased by means of irradiation with, for example, UV radiation.

During manufacture, the insulated conductive layer 11, 12, 13 and the conductor tracks 31 obtained from the same semiconductor layer are preferably used as doping masks, as described above. However, it is alternatively possible to use the control electrode 19 an etching and doping mask in a manner known per se. In this case, the conductor track 31 will preferably be manufactured from the same second semiconductor layer from which the control electrode 19 is also obtained.

Preferably, the circumference 18, 28 of the semiconductor zone 16, 17 has an edge portion which is remote from the injector region 14 and follows the first edge 7 of the thick insulating layer 6, which edge portion has a length which is at least equal to the channel width 36 of the channel 5 of the storage transistor. In the first embodiment, the circumference 18, 28 has two such edge portions, which have substantially the same length. The one edge portion faces the surface portion 4 and the other edge portion faces the channel region 5. In the second embodiment, the said edge portion of the edge 18 faces the region intended for the surface portions 4a, 4b and 4c.

If the second electrode region 4, 16, 17 has a strip-shaped projection 17a, 17b, this strip-shaped projection is advantageously located at least for the major part under the insulated conductive layer 11, 12, 13.

What is claimed is:

1. A semiconductor device having a storage cell with a main current path and comprising a non-volatile storage transistor having a charge storage region which comprises an insulated conductive layer, and a control electrode capacitively coupled to the insulated conductive layer, charge stored in the charge storage region representing stored information and the storage transistor being included in the main current path of the storage cell, comprising a semiconductor body with a substrate region of a first conductivity type and having a semiconductor surface, a first and a second electrode region and a channel region of the storage transistor located at said semiconductor surface, which form part of the main current path, the semiconductor surface locally adjoining a first thick insulating layer which, viewed on the semiconductor surface, is bounded by a first edge, the first and the second electrode region each forming a rectifying junction with an adjoining portion of said substrate region of the first conductivity type, a second insulating layer, the channel region being separated by said second insulating layer from a first part of the insulated conductive layer, and a third thin insulating layer, an injector region of a second conductivity type opposite to the first conductivity type at the semiconductor surface which adjoins the common substrate region and which, viewed on the semiconductor surface, is entirely enclosed by the first thick insulating layer and is separated by said third thin insulating layer from a second part of the insulated conductive layer, the first and the second part of the insulated conductive layer being interconnected by a third part separated by the first thick insulating layer from the semiconductor surface, and a semiconductor zone of the second conductivity type covered by the first thick insulating layer and forming an electrical connection for the injector region which forms part of the second electrode region, the injector region being doped more weakly than the semiconductor zone and the semiconductor zone, viewed on the semiconductor surface, having a circumference of which at least a part follows the contour of the first edge of the first thick insulating layer, while the third part of the insulated conductive layer has at least half the area of the insulated conductive layer.

2. A semiconductor device as claimed in claim 1, characterized in that the semiconductor zone forms at least a part of the main current path of the storage cell.

3. A semiconductor device as claimed in claim 1 or 2, characterized in that the main current path of the storage cell, viewed on the semiconductor surface, has a smallest width measured at right angles to the local current direction of the main current path which is at most substantially equal to the channel width of the storage transistor and is constituted at least at the area of this smallest width at least over half this width by the semiconductor zone located under the first thick insulating layer.

4. A semiconductor device as claimed in claim 1 or 2 characterized in that the second electrode region has a first surface portion which is bounded by the first edge of the first thick insulating layer, is not covered by this insulating layer and adjoins the semiconductor zone.

5. A semiconductor device as claimed in claim 4, characterized in that the surface portion is doped more highly than the semiconductor zone.

6. A semiconductor device as claimed in claim 4, characterized in that the second electrode region has a second surface portion which is bounded by the first edge of the first thick insulating layer, is not covered by this insulating layer, adjoins the semiconductor zone and has substantially the same doping as the first surface portion, the first and the second surface portion being electrically interconnected at least in part through the semiconductor zone.

7. A semiconductor device as claimed in claim 6, characterized in that the storage cell comprises an access transistor having a channel region, which is connected in series with the storage transistor, the second surface portion adjoining the channel region of the access transistor substantially over the whole width of this channel region.

8. A semiconductor device as claimed in claim 1 or 2 characterized in that the third part of the insulated conductive layer has a strip-shaped arm which comprises the first part of the insulated conductive layer.

9. A semiconductor device as claimed in claim 1 or 2, characterized in that the injector region, viewed on the semiconductor surface, is entirely enclosed by the semiconductor zone.

10. A semiconductor device as claimed in claim 9, characterized in that the semiconductor zone adjoins the channel region of the access transistor substantially over the whole width of this channel region.

11. A semiconductor device as claimed in claim 1 or 2, characterized in that the second electrode region has a strip-shaped projection which is formed by the semiconductor zone and comprises two parts, the injector region being located between these two parts.

12. A semiconductor device as claimed in claim 11, characterized in that the strip-shaped projection has a width measured at right angles to the longitudinal direction of the projection which is substantially equal to the width of the injector region measured substantially parallel thereto.

* * * * *